United States Patent [19]

Washburn et al.

[11] Patent Number: 5,604,673
[45] Date of Patent: Feb. 18, 1997

[54] LOW TEMPERATURE CO-FIRED CERAMIC SUBSTRATES FOR POWER CONVERTERS

[75] Inventors: Robert D. Washburn, Malibu; Robert F. McClanahan, Valencia; Andrew A. Shapiro, Orange, all of Calif.

[73] Assignee: Hughes Electronics, Los Angeles, Calif.

[21] Appl. No.: 479,293

[22] Filed: Jun. 7, 1995

[51] Int. Cl.⁶ .................................................... H01L 23/12
[52] U.S. Cl. ............................ 363/147; 361/782; 361/751
[58] Field of Search ................................ 357/80, 74, 75, 357/81; 174/52, 4; 361/40, 386, 321, 398, 399, 400, 750–751, 782, 783, 795, 811; 336/200, 215; 363/20, 21, 147; 3/335

[56] References Cited

U.S. PATENT DOCUMENTS 5,138,436  8/1992  Koepf ........................................ 357/74

Primary Examiner—Aditya Krishnan
Attorney, Agent, or Firm—Leonard A. Alkov; Wanda K. Denson-Low

[57] ABSTRACT

Electronic power conversion circuitry, for frequencies not exceeding 30 MHz, is manufactured using the benefits of low temperature co-fired ceramic substrates to provide interconnection between the discrete components of the power conversion circuit, and integrate various non-semiconductor devices into the body of the low temperature co-fired ceramic structure, such as resistors, capacitors, inductors and transformers. Use of a low temperature co-fired ceramic structure as a substrate on and within which power conversion circuitry is formed allows selection of various conductive and resistive inks to precisely form interconnection circuitry and selected non-semiconductor components which improves the stability and reduces the cost of power conversion circuits.

16 Claims, 3 Drawing Sheets

LOW TEMPERATURE CO-FIRED CERAMIC SUBSTRATES FOR POWER CONVERTERS

FIELD OF THE INVENTION

The present invention generally relates to fabrication of circuitry used in an electronic power converter. Low temperature co-fired ceramics can be used to form nearly all of the low power non-semiconductor components required to form electronic power converter circuitry. Low temperature co-fired ceramics allow precision passive components to be formed in precise alignment relative to each other, as an integral part of the substrate, effectively creating a power passive integrated circuit. It further permits all necessary components thus formed to be precisely trimmed to the desired value. Stripline and microstrip design techniques are readily applied using low temperature co-fired ceramic substrate construction, which can also include externally mounted discrete passives.

BACKGROUND OF THE INVENTION

We define "power converter circuitry" to refer strictly to power conversion circuits with operating frequencies not greater than 30 MHz.

The present invention generally relates to the fabrication of power converter circuitry formed on substrates which are made from low temperature co-fired ceramic material and which have the passive components as an integral part of the substrate. Previously, power converter substrates were formed on printed circuit boards, or as power hybrids. Printed circuit boards provide traces for interconnecting a number of discrete components which are usually soldered to the circuit board. Component mounting may be either surface or through hole. Hybrids are created using thick and/or thin film manufacturing techniques to create a single surface substrate which usually has non-critical, low power dissipation resistive elements integrally formed with it. Some small value, low power inductive elements can be formed on the surface of the hybrid with thick film techniques but most magnetic components must be discrete, and mounted external to the hybrid structure (usually attached to the power converter heat sink). As with the inductive components, low voltage capacitors can be formed on the top layer of the substrate using thick film processes. However, these techniques are not suitable for the construction of high value, power or current handling components. These are realized as discrete devices and are mounted either on the surface of the hybrid (for the smaller parts) or more frequently external to the hybrid. Active components, such as semiconductor devices, are typically epoxied to the surface of the hybrid substrate, and wire bonded using gold or aluminum wire to bonding sites on the surface of the hybrid substrate.

Both printed circuit boards and hybrids have disadvantages in fabrication. Printed circuit boards require the use of numerous discrete components. Each must be inserted into or onto the circuit board, where leads may require shaping or trimming, and then sent through a solder bath to attach the components to the circuit board. This can expose the components and the circuit board to temperatures in excess of 600 degrees Fahrenheit. Active components are especially sensitive to elevated temperatures and may be damaged by heating. Especially with high frequency applications, small precision inductors and capacitors are easily damaged by being exposed to this high temperature. In the case of surface mounted components, where the component leads may require bending and trimming, and the part properly oriented and placed on the surface, this problem of soldering heat exposure is also encountered. The preceding considerations apply both to wave soldering and hand soldering.

Although the criticisms of the state of the art listed in the previous paragraph can be substantiated as generally accurate, lest they give the mistaken impression that current methods are quite inadequate, it must be added that many good power supplies have been built with those techniques and used with satisfaction by their operators. For example, exposure of components to high temperature during soldering can unquestionably damage the devices, but this can be and often is avoided by proper techniques and controls in the manufacturing process along with good engineering practice in the design of the components. The present invention is superior in that it generally eliminates or greatly reduces the exposure of components to the stress of solder attachments (though this advantageous feature is not advocated as the most significant feature of the presently disclosed invention).

This invention can be constructed and frequently will be constructed with some soldered components (the active components, certain very large value energy storage devices, or certain very high precision components) which either can not be integrated into the low temperature co-fired ceramic substrate, or are used in discrete form at the discretion of the designer. However, this invention will always have a greatly reduced number of solder connections compared to present techniques. This will translate into a statistical reduction in the number of defective solder joints and thereby improve overall manufacturing yield.

The reduced number of solder connections in this invention is a major benefit to the long term reliability of power supplies, which typically have significant internal power dissipation. This can subject the components and connections to large and frequent temperature changes in addition to those caused by variations in the ambient temperature of the unit operating environment. This results in the application of significant mechanical stress on the solder joints and can lead to increasing failures as the product ages, particularly those with latent defects; however, the present invention ameliorates and alleviates this well known problem.

Variations in components, solder composition, heating of the solder, placement of the small components on the circuit board, variations in hole plating, and components floating partially out of the holes in the printed circuit board all lead to variations between devices manufactured on the same production line. This means that two consecutive power conversion devices manufactured on printed circuit boards can have a variation in characteristics significant enough to cause additional circuitry to compensate for the variability to be incorporated into the design, or expensive material and process controls added to the manufacturing process. In either case, the result is a significant increase in the cost of the power supply.

This matter of variability control is an important advantageous characteristic of the present invention which is significant not only in the assembly procedures which it eliminates, but with the materials, processes and components themselves. In the present art, each individual discrete component is made with a variety of different materials whose composition will vary from manufacturing lot to lot. Each is also fabricated with a variety of different processes, each element and step of which has its own variability. This variability is ultimately reflected in the characteristics and cost of the discrete components. The discrete components can even be made by different manufacturers who use totally different materials, processes, and controls. The only present, effective methods of limiting this variability are through the use of tight specifications which can place severe material and process controls on the component manufacturer, and compliance testing and screening to verify the effectiveness of the process controls. Both of these can significantly increase the cost of the discrete components and therefore the entire power supply.

The above-described variability is also not fixed or even defined with time. It is common for component manufacturers to "improve" their products and processes. Sometimes the use of these improved devices (the older forms of which are no longer made) results in power supplies, which have been produced and worked well for years, suddenly developing a variety of problems or not functioning at all (either generally or in particular applications or under particular conditions). Therefore the advantageous feature of variability control is expected to enhance the commercial utility of the present invention.

Hybrid fabrication also has its characteristic difficulties. Thin film hybrid techniques generally result in a superior conductive layer with respect to thick film techniques because a uniform thickness layer of gold or other conductive material is etched away to leave a uniform thickness conductor which has a precise predetermined width. Resistive inks are then screened onto the hybrid substrate and trimmed to the proper value by laser trimming, or sandblasting techniques (although there are precision thin film resistors which do not require trimming). Capacitors cannot be integrally combined with a thin film hybrid substrate.

Capacitors are attached by the use of solder paste, conductive epoxy, and/or wire bonding. Conductive epoxy is not as conductive. Also, solder preforms may be used. Active components are wire bonded to conductive pads on the hybrid substrate. Wire bonding techniques are not perfect, and wire bonding is usually followed by a wire bond pull test to insure the integrity of the wire bonds. Additionally, the wire bond must be made directly to the bonding pad of the semiconductor device. This requires local ultrasonic heating and vibration to etch the wire bond material into the wire bond site of the semiconductor device. Each pad must be individually bonded to the substrate. The thickness of each wire that can be bonded to the semiconductor device and the substrate is limited. Techniques have been applied that use multiple wire bonds or ribbon bonding to increase the current carrying capability of the connection. The use of these techniques increases the current carrying capability, but increases the number of fabrication steps required, and the complexity of those fabrication steps. Wire bonds are flexible and may be of varying lengths, thereby changing minute characteristics of inductance, etc.

There is a further limitation on the usefulness of thick film hybrid technology. It is well known that following firing, thick film resistors do not remain fixed during subsequent firings but continue to change characteristics. The subsequent firings appear to a previously fired resistor as an extended firing period with included temperature cycling under a different set of conditions (covered by the fired and/or dried material of subsequently applied layers). At best, the resistor tolerance is a function of the number of substrate firing cycles subsequent to its own formation and the tolerances associated with this processing. If they otherwise could be used as precision resistors, it would be necessary to locate them as close to the top of the substrate as possible (probably on a single layer), limit the number of resistive paste materials (probably to one), and severely restrict the total number of precision resistors (and networks) in the circuit. Furthermore, due to the limited thickness of hybrid film resistors, their power dissipation capability is small which limits their usefulness for power supply applications. As a result, thick film resistors are best utilized in low power dissipation circuit applications in which values are not critical.

Additionally, fabrication of printed circuit boards requires the extensive use of acids, photoresist, and other chemicals to deposit and etch circuit boards. Thin film hybrid manufacturing similarly requires use of numerous acids and photoresist to etch away metallization. Thick film hybrid manufacturing does not use the wide variety of active chemicals that are used in the manufacture of thin film hybrids, and printed circuit boards. However, because of the manner in which conductive layers are screened onto a thick film hybrid, the resistivity, shape and dimensional stability of a thick film hybrid circuit is more difficult to control.

The present invention significantly reduces the problems associated with building power conversion circuitry in hybrids or on standard printed circuit boards by reducing the number of manufacturing steps, reducing the variety of manufacturing steps, and implementing manufacturing steps and processes that can be more accurately controlled and with less effort than previous technology.

Also the present invention does not require the use of extensive chemical processes in order to manufacture a substrate which has superior electrical characteristics, and can be more easily and accurately manufactured at a lower cost than prior art devices.

The present invention is closely related to issued and co-pending patents assigned to the assignee of the present invention, including U.S. Pat. No. 4,980,810, issued Dec. 25, 1990 and pertaining to "VHF DC-DC Power Supply Operating at Frequencies Greater than 50 Mhz"; U.S. Pat. No. 5,055,966, issued Oct. 8, 1991, on "Via Capacitors within Multi-layer, Three-Dimensional Structures/Substrates,"; and U.S. Pat. No. 5,164,699, issued Nov. 17, 1992, on "Via Resistors within Multi-layer, Three Dimensional Structures/Substrates." The related co-pending applications include Ser. No. 07/951,072, filed Sep. 24, 1992 on "Magnetic Vias within Multi-layer, Three Dimensional Structures/Substrates;" Ser. No. 07/951,504 filed Sep. 24, 1992 on "Field Control and Stability Enhancement in Multilayer 3-Dimensional Structures;" Ser. No. 07/923,409, filed Jul. 31, 1992, on "Low-Temperature-Cofired-Ceramic (LTCC) Tape Structures Including CoFired Ferromagnetic Elements, Drop-In Components and Multi-Layer Transformer;" and Ser. No. 07/951,473, filed Sep. 24, 1992 on "Dielectric Vias within Multi-layer Three Dimensional Structures/Substrates."

SUMMARY OF THE INVENTION

The invention is generally related to the use of low temperature co-fired ceramics (LTCC) which function as both passive integrated circuits and substrates for power conversion modules. For present purposes, the terminology "power conversion" shall be restricted to refer only to electronic power conversion circuits with an operating frequency below 30 MHz. In general, optimal utilization of LTCC for power conversion will be achieved at VHF/UHF frequencies as described in co-pending application "Low Temperature Co-fired Ceramic VHF/UHF Power Converters" using resonant type circuitry similar to that described in U.S. Pat. No. 4,980,810, issued Dec. 25, 1990. At frequencies below 30 mhz, component size will generally require a significant number of the passive components to be discrete, external to the substrate. Partial compensation for this characteristic can be realized by the greater variety of power conversion circuit types and classes which operate in this frequency region and can be implemented with LTCC. LTCC has several distinct advantages over conventional circuit boards, including the following:

1. Many passive components (resistors, capacitors, inductors, and transformers) are made integral to and in the same process that forms the substrate. This saves the cost of the individual components.

2. Since the integrated passive components throughout the power supply are formed from the same materials, variations are both minimized and tend to be in one direction. Example: Variations in the resistivity of a resistor ink will be reflected in all of the resistors made using that ink. This makes them tend to be all high or all low by approximately the same percentage rather than following normal discrete component value distributions. This results in smaller variations in circuits such as resistor dividers where the ratio of values is important.

3. A co-fired ceramic has a coefficient of thermal expansion which more closely matches the thermal coefficient of expansion to the material of the integrated circuits (typically silicon but the LTCC can be formulated and processed to match other semiconductor materials such as GaAs, Ge, InP, etc.).

Combining the use of low temperature co-fired ceramics with the circuit and power requirements of power conversion circuitry has not previously been attempted. Combining these technologies produces unforeseen results not heretofore achieved.

The low temperature co-fired ceramic is capable of having unpackaged power semiconductor devices mounted on its surface. In this manner, heat can be more rapidly distributed from the semiconductor device, thus preventing the semiconductor device from overheating and burning out. The low temperature co-fired ceramic substrate can also have discrete passive components mounted on its surface. Certain passive components, such as resistors, also generate substantial quantities of heat depending on the particular circuit application.

The use of low temperature co-fired ceramics provides a platform for mounting the discrete devices. Unlike the previously used laminated boards, the low temperature co-fired ceramics can aid in heat distribution, through a combination of cavities, thermal vias, and embedded heat-spreading materials, helping to prevent overheating components. Ventilation holes can be formed in the low temperature co-fired ceramic structure to further encourage air flow and cooling of both the ceramic itself and the heated component.

Precision resistors, capacitors and inductors can be precisely formed within the low temperature co-fired ceramic structure, eliminating the need to attach discrete devices to the surface of the ceramic structure. This is especially useful when dealing with high frequency applications, where the values of the passive components are extremely small, and the variation in electrical characteristics due to any inefficiencies in attaching discrete components to circuit boards becomes critical.

It is an object of the present invention to achieve design requirements of power conversion circuitry utilizing the favorable characteristics and features of low temperature co-fired ceramic substrates to maximize the number of passive components which can be formed internal to the substrate.

It is a further object of the present invention to achieve design requirements of power conversion circuitry utilizing the favorable characteristics and features of low temperature co-fired ceramic substrates to mitigate the undesirable characteristics of known power converter substrates.

It is a further object of the present invention to utilize a low temperature co-fired ceramic substrate in power conversion circuitry in order to reduce the number of fabrication steps needed, resulting in an increased manufacturing yield. This benefit will be achieved because of the ability of low temperature co-fired ceramic substrates to have passive components embedded into the low temperature co-fired ceramic structure, thus reducing the number of discrete electronic components, which in turn reduces the number of assembly steps and the inherent cost of assembly.

It is a further object of the present invention to utilize the near hermetic character of low temperature co-fired ceramic substrates to fabricate passive components which are stable over a wide range of temperature and humidity, and are suitable for high volume production.

It is a further object of the present invention to improve the performance and reduce the cost of power conversion modules by utilizing the characteristics of low temperature co-fired ceramics. This includes conductivity of the conductor lines, and the ability to generate wide conductors or parallel conductors on multiple layers within the low temperature co-fired ceramic in order to achieve a high carrying capability. Further advantages include high dielectric voltage breakdown, the use of materials with variable dielectric constants, the ability to incorporate ferrites within the low temperature co-fired ceramic structure, the ease of manufacturing a structure having cavities which accommodate predetermined components, such as high power dissipation devices, and the use of thermal vias and metallic inserts to provide heat sinks, mitigating the adverse effects of thermal conductivity characteristics.

It is a further object of the present invention to create a low temperature co-fired substrate for power conversion circuitry which can incorporate a large majority of all passive components within the low temperature co-fired ceramic structure.

It is a further object of the present invention that the only devices attached to the external surface of the low temperature co-fired ceramic substrate will be principally active semiconductor components, and occasional high power dissipation or energy storage passive components, such as resistors, although use of other externally mounted discrete passives is not wholly excluded.

It is an object of the present invention to implement all forms of power conversion circuitry, including AC-AC, AC-DC, DC-DC, and DC-AC circuitry using a substrate formed out of low temperature co-fired ceramics. The use of the low temperature co-fired ceramic structure as an interconnection medium which incorporates substantially all of the discrete components within it results in a smaller power conversion module which has superior stability with respect to power conversion circuitry formed of discrete components. These power conversion modules are also less expensive to manufacture, and are easier to build because of the reduced number of highly reliable steps involved in constructing low temperature co-fired ceramics. These techniques include the use of cavities, thermal vias and heat sinks, resistive and capacitive inking systems, and conductive inking systems which are screened onto the ceramic substrate, then fired and precision trimmed with a laser or suitable apparatus to create highly precise component values.

DESCRIPTION OF AN EXEMPLARY PREFERRED EMBODIMENT

The preferred embodiment of the present invention implements power conversion circuits utilizing the superior characteristics of low temperature co-fired ceramic substrates, where by "power conversion circuits" frequencies not exceeding 30 MHz are denoted. The present invention combines the benefits of low temperature co-fired ceramic structures with electronic power conversion circuitry in order to create a circuit which is smaller, lighter, and easier to manufacture. These circuits include AC-DC, DC-DC, DC-AC, and AC-AC power conversion circuitry, and can be used individually or in combination with each other. For example, efficient DC-DC conversion can be accomplished by converting DC to a high frequency AC signal, and then converting the high frequency AC signal to a DC voltage of a different level than the input voltage. This type of conversion has benefits over standard linear conversion circuitry. Nearly all of the non-semiconductor (passive) components are manufactured as an integral part of the low temperature co-fired ceramic substrate.

Figure 1:
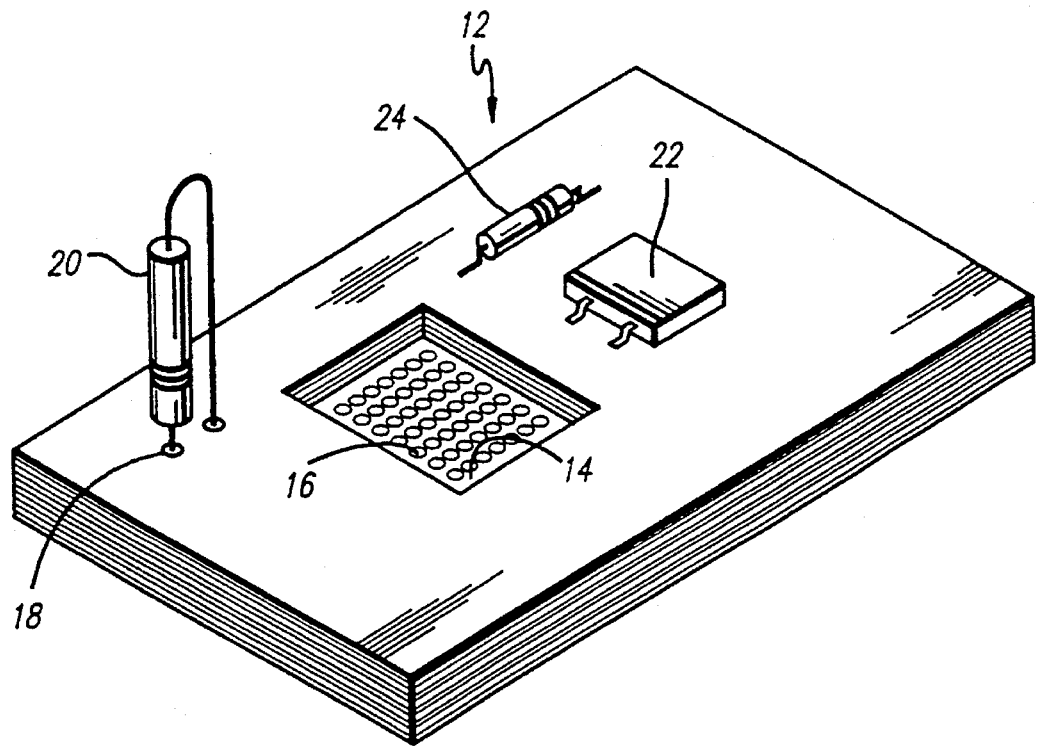
FIG. 1 is an external perspective drawing of a low temperature co-fired ceramic substrate showing examples of surface mounted components.

As shown in FIG. 1, the low temperature co-fired ceramic substrate consists of a plurality of layers. The ceramic layers insulate, and isolate metallized conductors which are selectively located on the outer surface, and various inner layers of the low temperature co-fired ceramic substrate. The low temperature co-fired ceramic substrate includes use of conductors which are fired in a reduced atmosphere, such as copper, and metallized conductors which are fired in the presence of air (termed oxidizing atmosphere firing), which is used for firing noble metals and alloys.

The low temperature co-fired ceramic substrate structure 12 of FIG. 1 shows a cavity 14 within the low temperature co-fired ceramic substrate 12. Thermal vias 16 are shown in the lower portion of cavity 14. A cavity 14 may be formed with or without forming thermal vias 16 in the surface of low temperature co-fired ceramic substrate 12 immediately beneath cavity 14. A cavity 14 is formed, as required by the application, in order to house discrete components which require substantial cooling, such as high power dissipation devices, or to house discrete components which would otherwise undesirably protrude above the surface of the low temperature co-fired ceramic substrate. These discrete components include semiconductor devices and non-semiconductor devices.

Heat sinks (not shown) can be inserted into low temperature co-fired ceramic substrate 12 in order to reduce thermal resistance through the low temperature co-fired ceramic substrate 12, and to dissipate heat generated by components on the surface of or within the low temperature co-fired ceramic substrate 12. Cavities 14, thermal vias 16 and heat sinks (not shown) provide thermal management of a low temperature co-fired ceramic substrate in order to prevent localized heating or super-heating, which may lead to unequal thermal expansion within low temperature co-fired ceramic substrate 12, resulting in microscopic thermal fractures of low temperature co-fired substrate 12.

The low temperature co-firing ceramic process permits the selection of numerous conductive inks, as required by the particular circuit configuration to be manufactured.

Low temperature co-fired ceramic substrate 12 has within it holes 18, which are formed in order to accommodate placement of through hole mounted discrete components 20 in low temperature co-fired ceramic substrate 12. Through hole mounted components 20 and holes 18 are selectively utilized to optimize performance of the electronic power conversion circuitry.

Semiconductor components are attached to low temperature co-fired ceramic substrate 12 as through hole mounted discrete components 20, or by the use of surface mounting techniques. Semiconductor devices which are attached to low temperature co-fired ceramic substrate 12 using surface mounting techniques must be encapsulated in a surface mount packaging 22. This includes the use of both the leadless and leaded surface mount device packages.

Non-semiconductor devices are attached to low temperature co-fired ceramic substrate 12, as required by the power conversion circuit design. An example of a discrete surface mounted non-semiconductor device 24 is indicated by reference number 24 in FIG. 1. Typically, non-semiconductor type devices which are attached to low temperature co-fired ceramic substrate 12 through the use of surface mounting techniques (such as 24) or through the use of hole mounted techniques (such as 20) are devices which are intended to dissipate a substantial amount of power and generate a substantial amount of heat, such as loading resistors.

Various strip line components 52 and 54 and microstrip components are formed within the low temperature co-fired substrate as required by the particular circuit design, and component values selected. As shown in FIG. 2, strip line inductors 30 and 32 can be readily formed and embedded within the temperature co-fired ceramic substrate. The dimensions of the traces will determine the particular component value. Making the trace wider or narrower, longer or shorter, will effectively alter the electrical characteristics of the component. Higher currents can be accommodated by using complex structures such as multilayer parallel conductors 42 and 44. Inductors on the order of nano-henrys are effectively formed in this manner.

Capacitors are also effectively formed in a similar manner. A parallel plate capacitor 38 is readily formed by locating two parallel structures adjacent to each other, separated by the low temperature co-fired ceramic structure in between. The dielectric constant of the low temperature co-fired ceramic structure and the size of the overlaid conductors thus determines the value of the capacitor. Capacitive values on the order of pico-farads are readily formed within a low temperature co-fired ceramic structure without occupying an excessive amount of area.

In order to effectively isolate electronic signals, the use of various ground plane layers 32, 54 and 58 is necessary. These ground planes provide sufficient electrical isolation between parallel or adjacent traces within a low temperature co-fired ceramic structure.

For devices 34 and 36 which generate a large amount of heat, cavities 37 and 48 can be formed within the low temperature co-fired ceramic structure, and a heat sink 36 inserted into cavity 37 to aid in thermal management of the circuit. Additional thermal management techniques includes placing a component 46 within the cavity as shown in FIG. 2 by reference number 46; and thermal vias 50 may be located within the LTCC substrate between an external heat sink 36 or 51 and devices 34 and 48 which generate a large amount of heat to further aid in thermal management. Large holes 60 and 62 can also be made through the entire LTCC substrate to accommodate heat sinks which are an integral part of package of large heat generating devices.

The use of multilevel resistor arrays 58 allows a designer to design and construct a circuit in which the output of an electronic device is oriented at right angles to the input of the electronic device. As will be appreciated, this minimizes crosstalk between the signal lines.

Figure 4:
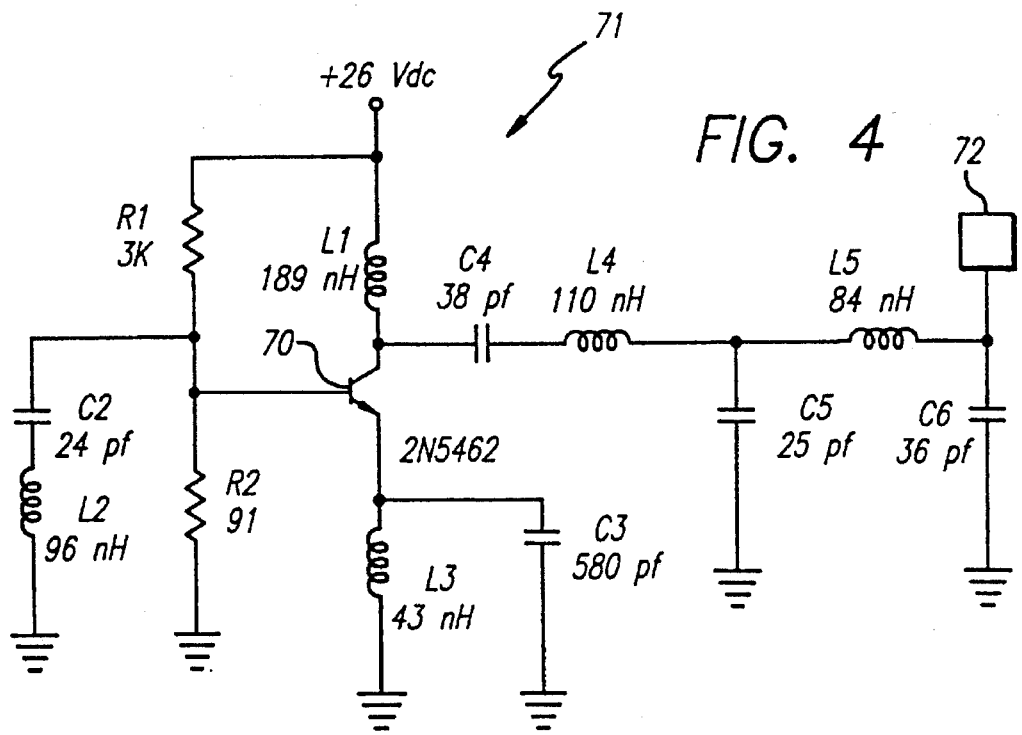
FIG. 4 is a schematic circuit diagram of a DC-AC converter employing the presently disclosed technology.
Figure 5:
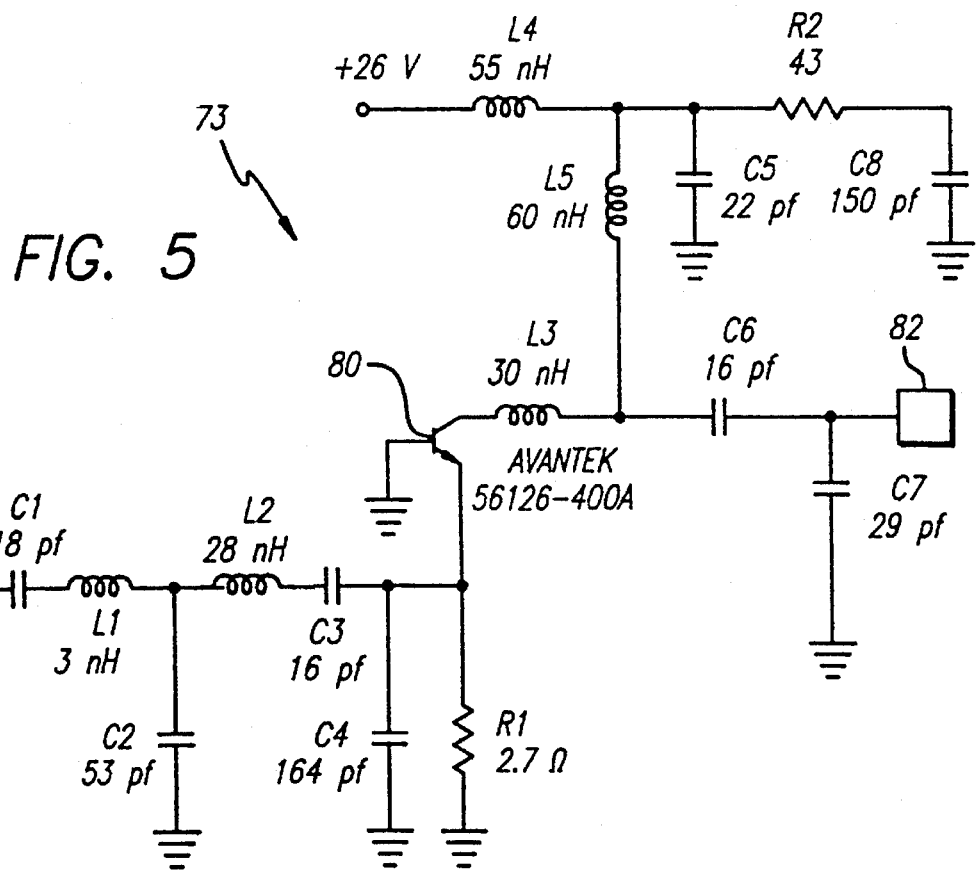
FIG. 5 is a schematic circuit diagram of a power amplifier employing this technology.

Power converters, such as the DC-AC converter 71 shown in FIG. 4, and the amplifier 73, as shown in FIG. 5, can be readily implemented using low temperature co-fired ceramic techniques. Because of the operating frequencies of these devices, the values of the components are extremely small, and are readily fabricated within a low temperature co-fired ceramic structure. The value of the inductors are all in the order of nano-henrys, and the value of the capacitors are all on the order of pico-farads. Several resistors are also needed to build the circuits. Various resistive inks are readily applied to create resistors, or resistor arrays buried within the low temperature co-fired ceramic.

The DC-AC power converter 71 shown in FIG. 4 requires a single semiconductor device 70, which is a transistor. This transistor 70 is mounted on the outer surface of the low temperature co-fired ceramic substrate, or placed within a cavity as desired.

The DC-AC power converter of FIG. 4 terminates in a 50 ohm resistive load 72. This is required for impedance matching with circuitry (not shown) external to the DC-AC converter shown in FIG. 4.

Figure 3:
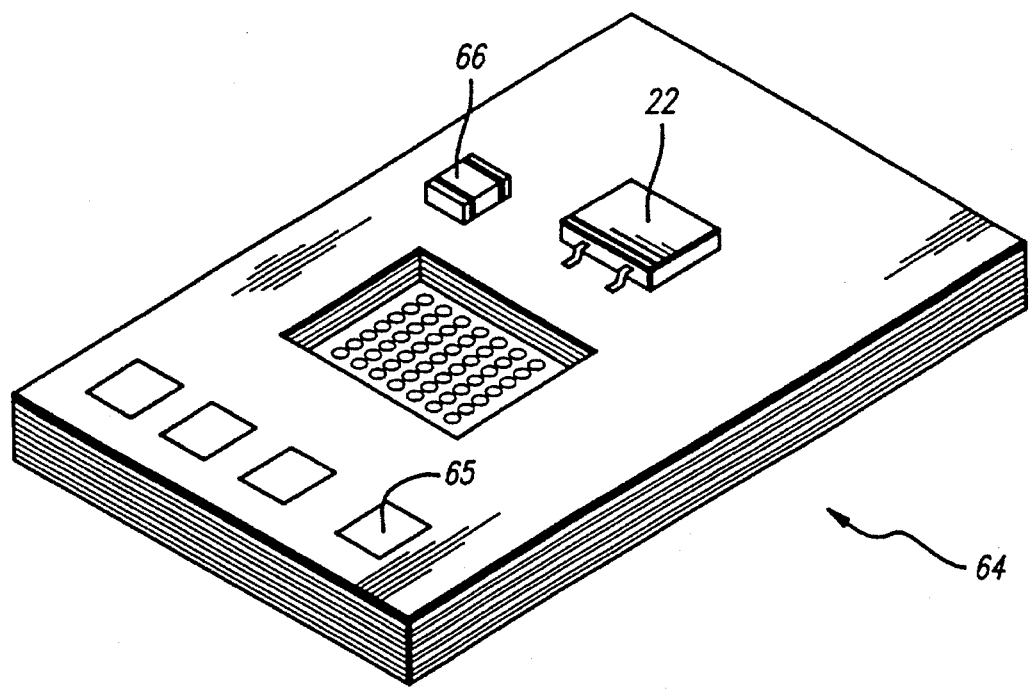
FIG. 3 is an external perspective drawing of a low temperature co-fired ceramic substrate showing examples of through hole mounted components.
Figure 2A:
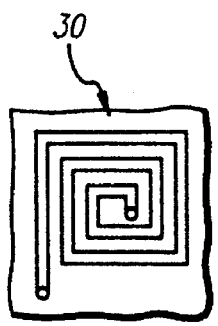
FIGS. 2a, c, e, g, i, k, m and o, constitute top views of these buried components, while FIGS. 2b, d, f, h, j, l, n and p, respectively, constitute corresponding side views.
Figure 2C:
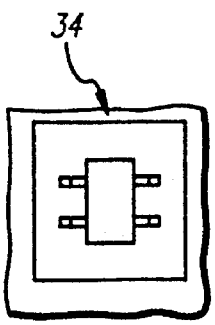
FIG. 2 contains cross-sectional depictions of certain physical details of the buried components which are not visible in the external views of FIG. 1 and FIG. 2.
Figure 2E:
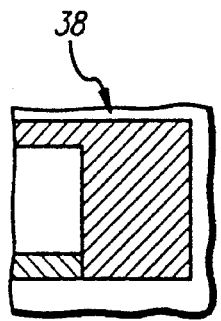
Figure 2G:
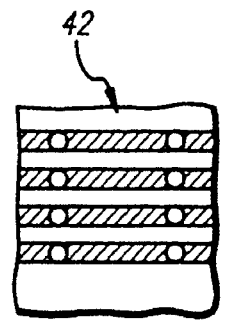
Figure 2B:
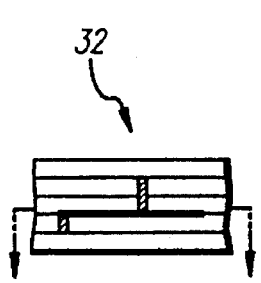
Figure 2D:
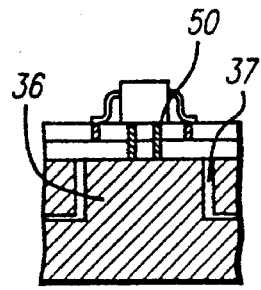
Figure 2F:
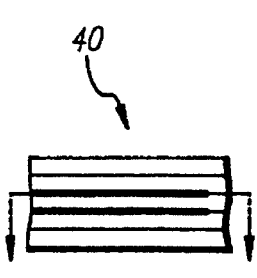
Figure 2H:
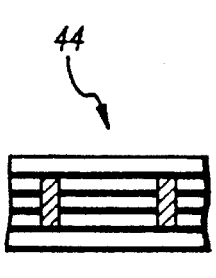
Figure 2I:
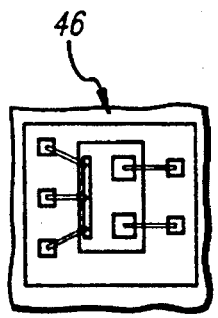
Figure 2K:
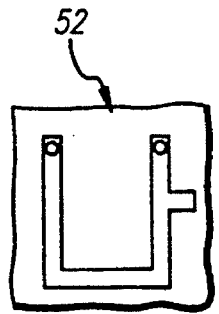
Figure 2M:
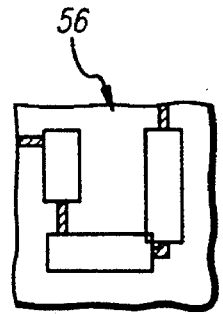
Figure 2O:
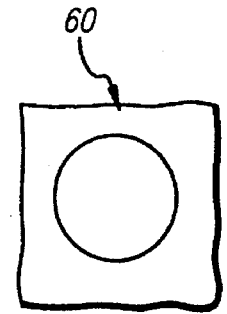
Figure 2J:
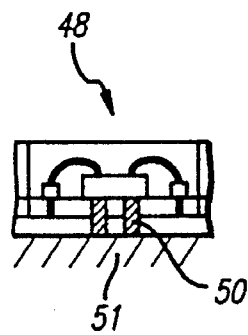
Figure 2L:
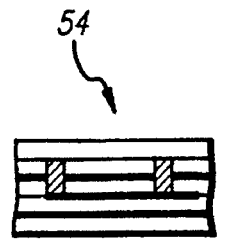
Figure 2N:
Figure 2P:
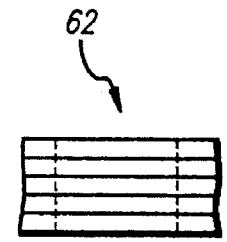

Because of the characteristics of the DC-AC converter, specifically the power level required, resistive load 72 must be capable of dissipating a substantial amount of power. While the resistive value could be readily achieved with an embedded resistor, because of the power dissipation and thermal heating that will accompany the power dissipation, resistor 72 is installed as a discrete component, either hole mounted in resistor 20 in FIG. 1, or surface mounted as resistor 24 in FIG. 1 or resistor 66 in FIG. 3. Another type of through hole 65 is depicted in FIG. 3. It should be added that the power level required is not critical and circuitry can be readily modified to match both higher and lower power values. The allowed values are limited by the allowed size of the substrate and the resulting high current or voltage values.

The amplifier 73 shown in FIG. 5 operates with a single semiconductor device 80. As with transistor 70 in FIG. 4, transistor 80 as shown in FIG. 5 can be surface mounted, such as item 22 in FIG. 1 or FIG. 3, on an external surface of the low temperature co-fired ceramic 12, or located in a cavity 14 as shown in FIG. 1.

Ramifications and Scope

Although the preceding description contains many specificities, these should not be construed as limiting the scope of the invention but merely as providing illustrations of some of the presently preferred embodiments of this invention. Those skilled in the most relevant arts will recognize that many variations upon the above examples are obvious and possible without departing from the spirit and scope of the present invention.

Accordingly the scope of this invention should be determined only by the appended claims and their appropriately construed legal equivalents, rather than by the examples given.

What is claimed is:

1. An electronic power converter circuit formed within a low temperature co-fired ceramic substrate comprising:

(1) a low temperature co-fired ceramic substrate comprising multiple layers; and (2) an electronic power converter circuit wherein a selected plurality of the passive components thereof are chosen from the group consisting of capacitors, resistors, inductors, and transformers and are formed as an integral part of one or more of said multiple layers of said low-temperature co-fired ceramic substrate.

2. An electronic power converter circuit formed within a low temperature co-fired ceramic substrate as described in claim 1, and further comprising at least one conductive layer located on or within the low temperature co-fired ceramic substrate, which electrically connects the circuitry of the electronic power converter circuit.

3. An electronic power converter circuit formed within a low temperature co-fired ceramic substrate as described in claim 2, and further comprising a plurality of conductive pads for electronically connecting the components of the electronic power converter circuit to said conductive layer.

4. An electronic power converter circuit formed within a low temperature co-fired ceramic substrate as described in claim 3, and further comprising at least one non-semiconductor element formed within said low temperature ceramic substrate.

5. An electronic power converter circuit formed within a low temperature co-fired ceramic substrate as described in claim 3, and further comprising at least one cavity formed within said low temperature co-fired ceramic substrate.

6. An electronic power converter circuit formed within a low temperature co-fired ceramic substrate as described in claim 5, and further comprising at least one thermal via formed within said low temperature co-fired ceramic substrate.

7. An electronic power converter circuit formed within a low temperature co-fired ceramic substrate as described in claim 1, and further comprising at least one discrete component mounted on said low temperature co-fired ceramic substrate.

8. A low temperature co-fired ceramic structure as defined in claim 1 in which said passive components comprise a power oscillator.

9. A low temperature co-fired ceramic structure as defined in claim 1, in which said passive components comprise an RF amplifier.

10. In a power conversion system incorporating a low temperature co-fired ceramic structure containing first and second filter networks, a low temperature co-fired ceramic structure containing a plurality of buried capacitor, buried inductor and buried resistor elements comprising:

a plurality of capacitors, inductors and resistors configured to form a first filter network and a plurality of capacitors, inductors and resistors configured to form a second filter network; and an active circuit amplifier means mounted on the external surface of said co-fired ceramic structure, the input to said amplifier means being supplied by the output of said first filter network, the input of said first filter network being supplied by external means, said output of said amplifier means driving the input of said second filter network.

11. In the power conversion system of claim 10, said low temperature co-fired ceramic structure comprising additionally:

transformer means coupled to said first filter network.

12. In the power conversion system of claim 11, said low temperature co-fired ceramic structure comprising additionally:

said transformer means buried within said structure.

13. In the power conversion system of claim 10, said low temperature co-fired ceramic structure comprising additionally:

transformer means coupled to said second filter network.

14. In the power conversion system of claim 13, said low temperature co-fired ceramic structure comprising additionally:

said transformer means buried within said structure.

15. A circuit for use in an electronic power converter formed on and within a low temperature co-fired ceramic substrate and comprising;

a low temperature co-fired ceramic substrate comprising multiple layers;

a plurality of circuit components formed as an integral part of one or more of said multiple layers of said low temperature co-fired ceramic substrate; and a plurality of circuit components mounted on or within said low temperature co-fired ceramic substrate.

16. A low temperature co-fired ceramic structure containing buried passive circuitry comprising:

a low temperature co-fired ceramic substrate comprising multiple layers; and passive circuitry formed as an integral part of one or more of said multiple layers of said substrate to provide said buried passive circuitry, wherein:

said passive circuitry includes at least one component selected from the class consisting of resistors, capacitors, inductors, and transformers;

said buried passive components being surrounded on all sides by non-conductive ceramic material;

said buried passive components being interconnected with other buried passive components by way of at least one interconnection means selected from the class consisting of vias and conductive structures;

said buried passive components being connected to other components which are not buried through interconnection contact pads which are located on a surface of said low temperature co-fired ceramic structure.

* * * * *